United States Patent
Lia et al.

[11] 4,048,665
[45] Sept. 13, 1977

[54] DRIVER CIRCUIT FOR PRINTER ELECTROMAGNET

[75] Inventors: Bruno Lia; Giorgio Vigini, both of Milan, Italy

[73] Assignee: Honeywell Information Systems Italia, Milan, Italy

[21] Appl. No.: 641,859

[22] Filed: Dec. 17, 1975

[30] Foreign Application Priority Data

Dec. 20, 1974 Italy .................................. 30809/74

[51] Int. Cl.² ............................................ H01H 47/32
[52] U.S. Cl. ........................................ 361/152; 323/9
[58] Field of Search .................. 317/DIG. 4, 148.5 R, 317/149, 123, 31, 33 R, 33 VR; 323/4, 9

[56] References Cited

U.S. PATENT DOCUMENTS

| | | | |
|---|---|---|---|
| 2,841,757 | 7/1958 | Shields | 323/4 |
| 2,978,630 | 4/1961 | De La Tour | 323/4 |
| 3,078,393 | 2/1963 | Winston | 317/DIG. 4 X |
| 3,234,453 | 2/1966 | Klees et al. | 317/33 VR X |
| 3,246,233 | 4/1966 | Herz | 317/DIG. 4 X |
| 3,293,505 | 12/1966 | Miller | 317/DIG. 4 X |
| 3,327,201 | 6/1967 | Brantley, Jr. | 317/33 VR X |
| 3,582,734 | 6/1971 | Bryden | 317/DIG. 4 X |
| 3,786,314 | 1/1974 | Misch | 317/DIG. 4X |
| 3,896,346 | 7/1975 | Ule | 317/DIG. 4 X |
| 3,909,681 | 9/1975 | Compari et al. | 317/31 X |

*Primary Examiner*—Donovan F. Duggan
*Assistant Examiner*—Patrick Salce
*Attorney, Agent, or Firm*—Lewis P. Elbinger; Ronald T. Reiling

[57] ABSTRACT

A circuit for energizing the electromagnet of the print head of a high speed impact printer, wherein such circuit operates effectively with an unregulated supply voltage by providing energization current pulses whose level and duration are dependent on the present level of such supply voltage.

8 Claims, 2 Drawing Figures

DRIVER CIRCUIT FOR PRINTER ELECTROMAGNET

BACKGROUND OF THE INVENTION

This invention relates to driver circuits for high-speed electromagnets, and more particularly to driver circuits for energizing electromagnets of the type which actuate hammers or needles in high-speed impact printers employed in data processing systems.

Driver circuits for such high-speed electromagnets have been required to satisfy severe requirements, including providing fast magnetization of the electromagnet and providing a high level of repeatability in operation so as to have minimum variation in the print quality and actuation time during successive energizations of the electromagnet.

One form prior art of driver circuit for satisfying such requirements utilizes a voltage controlled energization system providing a first high energization voltage and a second lower holding voltage, applied during appropriate and successive periods. Such system must have precise voltage controlled power supplies. In addition, to assure, during each energization, the complete magnetization of the magnetic circuit, a substantial amount of energy must be wasted, with accompanying oversized and excessively costly power supplies.

Another form of prior art driver circuit for satisfying such requirements utilizes an unregulated energization system in which the energization is held until a preestablished current level is reached, whereupon the energization is switched off as the electromagnet winding is shorted, at least for a predetermined duration, so that the electromagnet continues to be magnetized. This form of driver circuit is particularly effective if the energization time necessary for saturating the core of the electromagnet is less than the time required for the electromagnet armature to move. However, a very high supply voltage is required, with the accompanying requirement for employing components that must withstand such high voltages.

Accordingly, it is the principal object of the present invention to provide a simple driver circuit which satisfies the above specified requirements; namely, providing fast magnetization of the associated electromagnet and providing outstanding repeatability in operation with limited variation in the print quality and actuation time of the electromagnet during successive energizations.

Another object of the present invention is to provide a driver circuit for an electromagnet which operates with supply voltages of moderate level.

Another object of the present invention is to provide a driver circuit for an electromagnet which operates with supply voltages that are not stabilized.

Another object of the present invention is to provide a circuit for supplying the magnetomotive force necessary to saturate the magnetic circuit of an electromagnet, while assuring under conditions of variation in the level of the supply voltage the necessary attractive force and momentum required by the armature of such electromagnet.

Another object of the present invention is to provide a driver circuit for an electromagnet in which the amount of resistive losses in the winding is substantially constant during each energization cycle thereby providing for using windings of optimum size for dissipating the consequent thermal energy to the surroundings.

SUMMARY OF THE INVENTION

The driver circuit of the present invention is provided with a switch for controlling the current flowing through the winding of the electromagnet and a detector of such current. A bistable circuit having a controllable triggering level operates to actuate the switch upon receipt of a command trigger signal and to hold such switch actuated until such time as the current then following in the winding reaches a threshold value which is automatically adjusted in dependence on the level of the supply voltage.

BRIEF DESCRIPTION OF THE DRAWING

The invention will be described with reference to the accompanying drawing, wherein.

DESCRIPTION OF THE PREFERRED EMBODIMENT

Figure 1:
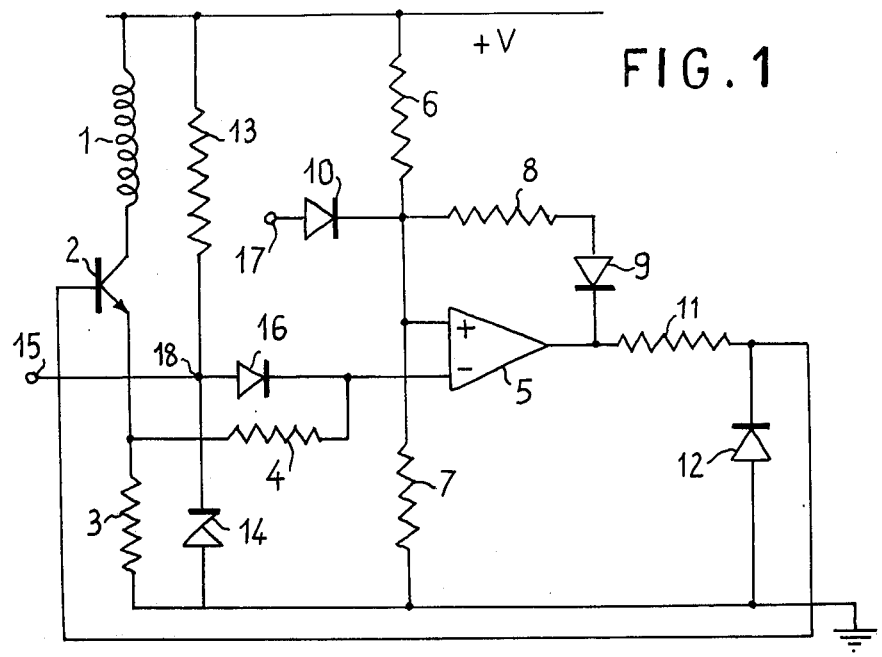
FIG. 1 is a schematic diagram of the preferred embodiment of the driver circuit of the invention.

The driver circuit of FIG. 1 comprises a winding 1 of an electromagnet, one terminal of such winding being connected to an unregulated positive voltage source $+V$. A switching transistor 2 controllably connects the other terminal of winding 1 to a common reference voltage source, or ground. Transistor 2 is preferably connected on the low voltage, or ground, side of winding 1 to simplify the driving of the transistor, as is well-known in the art.

The collector of transistor 2 is connected to one terminal of winding 1. A resistor 3, of relatively low ohmic value, for example 0.5 ohms, couples the emitter of transistor 2 to ground, resistor 3 thereby functioning as a current detector.

The inverting input terminal of a differential amplifier 5 is coupled to the emitter of transistor 2 through a resistor 4 which is of relatively high ohmic value, for example, 10 Kohms. The inverting input terminal of a differential amplifier provides for a negative output voltage to be delivered by the amplifier when a positive voltage is applied to such terminal. The non-inverting input terminal of differential amplifier 5 is connected to the junction point of a voltage divider, which comprises resistors 6 and 7 connected in series between voltage source $+V$ and ground. The non-inverting input terminal of a differential amplifier provides for a positive output voltage to be delivered by the amplifier when a positive voltage is applied to such terminal. Appropriate ohmic values for resistors 6 and 7 are, for example, 100 Kohms and 10 Kohms respectively, which values cause the voltage divider comprising such resistors to apply to the non-inverting input terminal of amplifier 5 a value of voltage which is 1/11 of the value of voltage $+V$.

A positive feedback path, comprising a resistor 8 and a diode 9 connected in series, is coupled to differential amplifier 5 and provides a unidirectional path for current flow between the non-inverting input terminal and the output terminal of amplifier 5. An appropriate ohmic value for resistor 8 may be, for example, 10 Kohms. When the level of voltage at the output terminal of differential amplifier 5 is less positive then the voltage level applied to the non-inverting input terminal of the amplifier, diode 9 of the positive feedback path conducts, thereby clamping the voltage applied to the non-inverting input terminal to substantially the level of the voltage the output terminal, except for a very small voltage difference due to the voltage drops across resistor 8 and diode 9.

The non-inverting input terminal of differential amplifier 5 is also coupled to an input terminal 17 through a diode 10, which is poled to conduct current toward the non-inverting input terminal.

A resistor 11, having an ohmic value, for example, of 1 Kohm, couples the output terminal of differential amplifier 5 to one terminal of a diode 12, which is poled to conduct current toward such output terminal. The other terminal of diode 12 is connected to ground. The junction point of resistor 11 and diode 12 is connected to the base of switching transistor 2.

A reset network for initializing the driver circuit of FIG. 1 comprises a resistor 13 and a zener diode 14 connected in series. One terminal of resistor 13 is connected to voltage source $+V$. One terminal of zener diode 14 is connected to ground, diode 14 being poled to conduct normal current toward resistor 13.

The junction point 18 of series connected resistor 13 and zener diode 14 is connected to a reset input terminal 15. Junction point 18 is coupled to the inverting input terminal of differential amplifier 5 through a diode 16, which is poled to conduct current toward the inverting input terminal.

The operation of the driver circuit of FIG. 1 will now be described. When the voltage of voltage source $+V$ is initially applied to the driver circuit, an initial positive voltage, which depends on the relative values of resistors 6 and 7, is applied to the non-inverting input terminal of differential amplifier 5. However, at this time, zener diode 14 begins to "break down," whereby a positive voltage equal to the zener voltage developed across zener diode 14 is applied through the then conducting diode 16 to the inverting input terminal of amplifier 5.

Because the positive zener voltage applied to the inverting input terminal of differential amplifier 5 is more positive when the initial voltage applied to the non-inverting input terminal of amplifier 5 due to the voltage divider action of resistors 6 and 7, an initial negative output voltage is delivered by amplifier 5. This initial negative output voltage delivered by amplifier 5 causes conduction of diode 9, which thereupon clamps the voltage at the non-inverting input terminal of the amplifier to substantially the level of such negative voltage. Accordingly, following the initial application of the voltage of voltage source $+V$, amplifier 5 is maintained in a stable state delivering a negative output voltage.

The negative output voltage delivered at this time by amplifier 5 is coupled through resistor 11 to the base of transistor 2, which is thereupon maintained at a voltage slightly negative with respect to ground as a consequence of the voltage drop across the then conducting diode 12. Accordingly, transistor 2 is maintained in a non-conducting state at this time.

Following the initial application of the voltage of voltage scource $+V$ to the driver circuit, and after an interval sufficient for the supply voltage to stabilize (as well as other voltage sources supplying other associated logic circuits, not shown), a signal of zero voltage is applied to reset input terminal 15. Such signal may be generated, for example, by grounding terminal 15.

When the voltage at terminal 15 drops to the value zero, diode 16 ceases conduction, whereby the inverting input terminal of amplifier 5 assumes the voltage of resistor 4, which now is at ground level, because transistor 2 continues to be non-conductive and no current flows through resistor 3.

However, despite the drop in voltage at the inverting input terminal of amplifier 5, such amplifier continues in the state in which its output voltage is at a negative level. This continuance is due to the continued conduction of diode 9, which thereby continues to clamp the voltage level of the non-inverting input terminal to that of the negative output voltage. Nevertheless, with terminal 15 grounded, the driver circuit is now prepared to be triggered to its other state.

The driver circuit is now triggered by the application of a positive pulse of appropriate duration, for example 100 micro-seconds, to input terminal 17. This pulse passes through conducting diode 10 and raises the voltage applied to the non-inverting input terminal of amplifier 5, which thereupon is triggered to change its state and deliver a positive output voltage. This positive output voltage thereupon reverse biases diode 9 to block the feedback path of which diode 9 is a part. At the same time, the positive output voltage delivered by amplifier 5 is coupled through resistor 11 to the base of transistor 2, which thereupon switches to its conductive state.

After this moment, because the non-inverting input terminal of amplifier 5 is no longer clamped to the amplifier output terminal through diode 9, if the pulse applied to terminal 17 is removed the non-inverting input terminal will assume the positive voltage imposed by the voltage divider action of resistors 6 and 7 and amplifier 5 will continue in the state producing a positive output voltage. Accordingly, the continuance of amplifier 5 in this latter state is not dependent on the duration of the pulse applied to terminal 17, but instead, depends upon the operation of the circuit elements which include winding 1.

When transistor 2 is switched to its conductive state, the current through winding 1 commences rising exponentially as a function of time, energizing the electromagnet and resulting in a corresponding exponentially rising voltage across resistor 3, which is transmitted to the inverting input terminal of differential amplifier 5. When this rising voltage at the inverting input terminal of amplifier 5 reaches the value of the voltage then being applied to the non-inverting input terminal of the amplifier, amplifier 5 functions as a flip-flop, switching to its opposite state and delivering a negative output voltage. Such negative output voltage is now maintained steady and stable by means of the now conducting diode 9 of the feedback path.

When amplifier 5 switches to this last-named state, transistor 2 is once again switched to its non-conducting state and winding 1 becomes deenergized. A new triggering pulse can once again be applied to input terminal 17, and the electromagnet energized again, after a delay which depends on the frequency of energization which can be accepted by the electromagnet.

There will now be described the effect on the level of current which is developed in winding 1 and the duration of the electromagnet energizing pulse as a function of changes in the supply voltage of the driver circuit. The reference voltage which is applied to the non-inverting input terminal of differential amplifier 5 is given by the expression $V_r = \alpha \times V$, where $\alpha$ is a factor depending on the relative values of resistors 6 and 7 and $V$ is the supply voltage provided by voltage source $+V$. Consequently, if the supply voltage $v$ varies, which is to be anticipated from an unregulated voltage source, the reference voltage $V_r$ correspondingly changes.

The voltage developed across resistor 3 is given by the expression $V_3 = i \times R_3$, where $i$ is the instantaneous current flowing in winding 1 (neglecting the base current of transistor 2, the current drain at the inverting input terminal of amplifier 5, and the reverse current through diode 16, all of such currents being less than the current flowing through winding 1 by some orders of magnitude). It is known that the current flowing in a linear, perfect, initially discharged inductor is given by the expression.

$$i = \frac{V}{R}\left(1 - e^{-t/T}\right),$$

where $V$ is the supply voltage, $R$ is the circuit resistance, $T$ is the time constant of such circuit (the ratio between the inductance $L$ and the resistance $R$), and $t$ is the time as a variable measured from the initial moment of energization of the circuit. Accordingly, the voltage $V_3$ developed across resistor 3 is given by the expression:

$$V_3 = \frac{VR_3}{R}\left(1 - e^{-t/T}\right).$$

As has been described previously herein, when the voltage applied to the inverting input terminal of amplifier 5, which is the voltage $V_3$ developed across resistor 3, becomes equal to the voltage applied to the non-inverting input terminal of such amplifier, which is the voltage $V_r$, amplifier 5 is switched and winding 1 becomes deenergized. This criterion may be expressed by equating the above specified expression for reference voltage $V_r$ to the last specified expression for voltage $V_3$. Because the value $V$ of the supply voltage appears on both sides of such an equation, it is apparent that the time, $t_1$, at which the condition of equality occurs, and, therefore, the duration of the energization interval of the electromagnet, is independent of the value of the supply voltage for a linear inductor.

On the other hand, the level of current $i$ which is developed in winding 1, and, consequently, the level of magnetization of the electromagnet and the level of energy stored in its magnetic circuit, is proportional to the supply voltage for a linear inductor.

However, the electromagnet of winding 1 is not a linear inductor, but, instead, is subject both to saturation and to inductance change due to the change in the length of the air gap following movement of the armature. According, the behavior of the current flowing in the winding of such electromagnet differs slightly from the expression given above.

Figure 2:
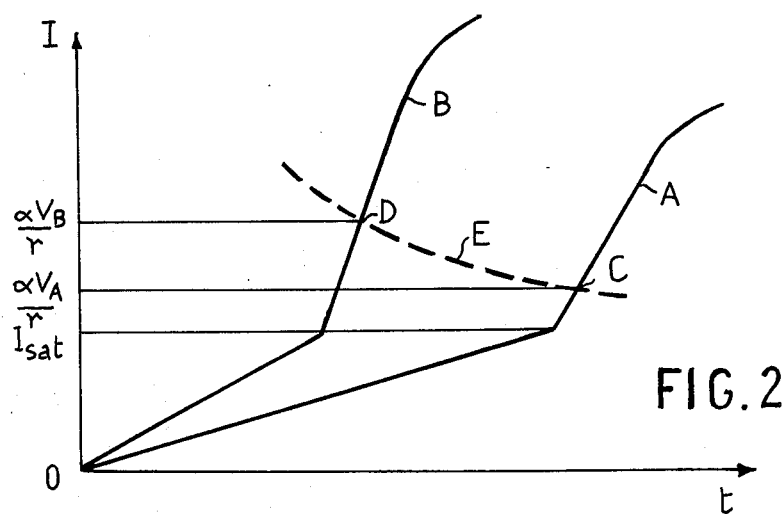
FIG. 2 illustrates waveforms of the current flowing in the winding shown in FIG. 1, for two different values of supply voltage.

In the illustrations of the waveforms of current flowing in winding 1, FIG. 2, the portions of such waveforms which are illustrated are remote from the portions of the waveforms representing the steady state level of current. These exponentially rising waveform portions can be represented by waveform segments of appropriate slope.

The initial slope of the current versus time waveform for winding 1 is given by the expression:

$$\frac{di}{dt} = \frac{V}{RT} = \frac{V}{L},$$

where $L$ has a relatively high value. This initial rate of change of current continues substantially unchanged so long as the current flowing through winding 1 is less than the saturation value, Isat. After the current reaches this saturation value, the inductance becomes considerably lower, whereupon the slope of the waveform becomes much greater and then decreases exponentially.

Wave forms A and B in FIG. 2 illustrate the behavior of the current flowing in winding 1 as a function of two different values $V_A$ and $V_B$ of supply voltage, wherein $V_B > V_A$. These two waveforms illustrate that when the supply voltage is greater, the saturation current level is reached faster.

The energization interval has been defined as the time for the current through winding 1 to develop a voltage across resistor 3 equal to the reference voltage $V_r$. For the two cases illustrated, the energization interval terminates respectively when:

$$i = \frac{\alpha V_A}{R} \text{ and } i = \frac{\alpha V_B}{R},$$

represented in FIG. 2 by points C and D respectively. Accordingly, the energization interval decreases with an increase in the supply voltage, provided that the knee of the exponential curve is not passed.

It can be demonstrated that by approximating the current waveforms by straight-line segments, as illustrated in FIG. 2, the locus of the points of termination of the energization interval, e.g. points C and D, can be represented by a hyperbola, a portion of which is represented by the dashed line E. Such hyperbola representation connotes that the final level of magnetization of the electromagnet varies inversely as the energization interval.

The above described form of adjustment of the energization intervals and magnetization levels as a function of changes in the supply voltage, provided by the instant invention, has several beneficial effects on the behavior of the electromagnet, as will be described hereinafter.

The momentum imparted to the armature of the electromagnet is given by the expression $m \times v$, where $m$ is the effective mass of the armature and $v$ is the velocity of the armature, such momentum representing the impact energy imparted to the armature. This expression for momentum is obtained by integration of the well-known formula $f = m \times a$, where $f$ is the force and $a$ is the acceleration, such integration being represented by:

$$m \times v = m \int_0^t a\, dt = \int_0^t f\, dt.$$

The instantaneous attractive force $f$ exerted on the armature is dependent on the instantaneous value of the magnetic flux induced in the magnetic circuit, i.e., the instantaneous level of magnetization. To simplify the instant analysis, it may be assumed, without substantial error, that the inductance of the electromagnet and, hence, of winding 1, remains constant. With such assumption, to instantaneous force $f$ is proportional to the square of the instantaneous value of the energization current.

From the mathematical relationships described above, if the energization of the electromagnet is switched off at the same level of current for the two different values of supply voltage, $V_A$ and $V_B$, the momentum imparted to the armature will be greater for case A, that of the smaller supply voltage, than for case B. On the other hand, if the energization of the electromagnet is switched off at a higher level of current for case B than for Case A, following the dashed line of FIG. 2, the momentum imparted to the armature in the two cases becomes more nearly equal. The mathematical analysis supporting such adjustment, or correction, of the imparted momentum is not necessary to the instant description and is not provided herein. However, for practical purposes such adjustment, or correction, is adequate to meet the requirements imposed on electromagnets of the type used in high-speed printers, wherein fluctuations between ± 20% may occur in the supply voltage.

Another beneficial effect of the instant invention is that because the circuit of FIG. 1 provides that the integral of the square of the energization current of the electromagnet for each energization pulse remains relatively constant, in spite of changes in the supply voltage, the resistive losses are also substantially constant for each printing event. Such result permits of providing a winding of optimum size to dissipate the constant thermal energy generated each printing event from the resistive losses, instead of having to provide, as in the prior art, a winding of size to dissipate the maximum possible thermal energy generated as the supply voltage changes.

Another embodiment of the instant invention provides a different form of circuit for providing the varying reference voltage that establishes the level of current at which transistor 2 is switched off. Thus the driver circuit of FIG. 1 provides for such reference voltage to vary in direct proportion to changes in the supply voltage, as a consequence of the voltage divider action of resistors 6 and 7. The alternative embodiment, on the other hand, provides non-linear electrical networks and diodes, connected in series with the voltages divider coupled to the non-inverting input terminal of differential amplifier 5 or with resistor 3, to control the function by which the reference voltage varies with changes in the supply voltage. This alternative embodiment causes the introduction of fixed voltage pedestals in the reference voltage function, which have the effect of reducing or enhancing, as is required, the characteristics of the adjustment introduced.

The present invention may also be complemented by an auxiliary electrical circuit for detecting and identifying electrical faults, such circuits being described for example in U.S. Pat. No. 3,909,681 for a DRIVING CIRCUIT FOR PRINTING ELECTROMAGNET, by A. Compari and G. Vigini assigned to the assignee of the present application.

While the principles of the invention have now been made clear in an illustrative embodiment, there will be immediately obvious to those skilled in the art many modifications in structure, arrangements, the portions, the elements, materials and components used in the practice of the invention, and otherwise, which are particularly adapted for specific environments and operating requirements, without departing from those principles. The appended claims are therefore intended to cover any such modifications, within the limits only of the true spirit and scope of the invention.

We claim:

1. A driver circuit for supplying the winding of an electromagnet with a controlled current provided by an unregulated voltage source, comprising:
   a switch connected in series with said winding;
   a current detector coupled to detect the current flowing in said winding and to deliver a voltage signal related to the current flowing in said winding;
   a reference circuit for generating a reference voltage whose level varies as a predetermined function of the voltage provided by said source; and
   a controllable bistable device operable in either one of first and second stable states and transferrable from the one of said states in which it is operating to the other of said states upon receipt thereby of a respective trigger signal, said device delivering an output signal when said device is operating in said first state, said device being transferred to said first state upon receipt of an input command signal and being transferred to said second state when the level of said voltage signal exceeds the level of said reference voltage, said output signal enabling said switch to transfer current through said winding.

2. The driver circuit of claim 1, wherein said reference circuit comprises a voltage divider connected between said voltage source and ground.

3. The driver circuit of claim 1, wherein said bistable device comprises a differential amplifier.

4. A driver circuit for controlling the current delivered to the winding of an electromagnet by a voltage source, comprising in combination:
   a controllable switch;
   means coupling said switch to said winding, whereby when said switch is actuated current is enabled to flow through said winding from said source;
   a current sensor coupled to sense the current flowing through said winding and to deliver a first output signal having a level of voltage related to the quantity of current flowing through said winding;
   a reference circuit coupled to said source and responsive to the level of voltage supplied by said source for delivering a second output signal having a level of voltage related to the level of voltage supplied by said source;
   a bistable circuit operable in either of first and second states and transferrable from the one of said states in which it is operating to the other of said states upon receipt thereby of a respective trigger signal, said bistable circuit being responsive to the application of an input signal to said driver circuit for transferring to said first state, said bistable circuit being responsive to the relative levels of said first and second output signals for transferring to said second state when the level of voltage of said first output signal exceeds the level of voltage of said second output signal, said bistable circuit delivering a third output signal when said bistable circuit is in said first state; and
   means for transferring said third output signal to said switch for actuating said switch during the duration of occurrence of said third output signal.

5. The driver circuit of claim 4, wherein said bistable circuit comprises a differential amplifier.

6. A driver circuit for supplying the winding of an electromagnet with a controlled current provided by an unregulated voltage source, comprising:
- a switch connected in series with said winding, said switch being operable in a current passing state and a current inhibiting state;
- a current detector coupled to detect the current flowing in said winding and produce a winding signal whose voltage is related to the magnitude of the current flowing in said winding;
- a reference circuit connected to sid unregulated voltage source for generating a reference signal whose voltage varies as a predetermined function of the voltage variations of said source; and,
- a controllable bistable device having first and second input terminals and an output terminal, said first input terminal being coupled to said reference circuit to receive said reference signal and said second input terminal being coupled to said current detector to receive said winding signal, said first input terminal also being coupled to receive a trigger signal, said output terminal being coupled to said switch for controlling the state of said switch, said bistable device having first and second output states represented by corresponding signals delivered at said output terminal, said first output state causing said switch to be controlled to operate in its current passing state and said second output state causing said switch to be controlled to operate in its current inhibiting state, said first and second output states being controlled by the polarity of the voltage difference existing between said two input terminals, the polarity of said voltage difference when a trigger signal of an appropriate level is applied to said first input terminal causing said bistable device to have said first output state, said first output state continuing until the polarity of the difference between the voltage of said winding signal and said reference signal causes said bistable device to have said second output state.

7. The driver circuit of claim 6, wherein said controllable bistable device comprises a differential amplifier.

8. The driver circuit of claim 6, wherein said controllable bistable device comprises a differential amplifier and a positive feedback path connected between an output terminal of said amplifier and an input terminal of said amplifier.

* * * * *